United States Patent
Van Bilsen et al.

(10) Patent No.: US 6,284,048 B1
(45) Date of Patent: Sep. 4, 2001

(54) METHOD OF PROCESSING WAFERS WITH LOW MASS SUPPORT

(75) Inventors: Franciscus Bernardus Maria Van Bilsen, Phoenix; Jason Mathew Layton, Chandler; Ivo Raaijmakers, Phoenix, all of AZ (US)

(73) Assignee: ASM America, Inc, Phoenix, AZ (US)

( * ) Notice: Subject to any disclaimer, the term of this patent is extended or adjusted under 35 U.S.C. 154(b) by 0 days.

(21) Appl. No.: 09/596,628

(22) Filed: Jun. 19, 2000

Related U.S. Application Data

(62) Division of application No. 09/184,491, filed on Nov. 2, 1998, now Pat. No. 6,121,061
(60) Provisional application No. 60/064,566, filed on Nov. 3, 1997.

(51) Int. Cl.[7] .................................................. C23C 16/00
(52) U.S. Cl. ........................ 118/666; 118/663; 118/725; 118/728; 219/444.1; 219/494; 219/497; 392/416; 374/120
(58) Field of Search .................................. 118/663, 666, 118/725, 728, 729, 730; 219/497, 444.1, 494; 392/416; 374/1, 120

(56) References Cited

U.S. PATENT DOCUMENTS

| | | | |
|---|---|---|---|
| 3,560,252 | 2/1971 | Kennedy | 117/107 |
| 3,615,931 | 10/1971 | Arthur, Jr. et al. | 148/175 |
| 3,641,974 | 2/1972 | Yamada et al. | 118/48 |
| 3,796,099 | 3/1974 | Shimotsuma et al. | 73/355 EM |
| 3,969,943 | 7/1976 | Ohno et al. | 73/355 EM |
| 4,001,586 | 1/1977 | Fraioli | 250/345 |
| 4,435,092 | 3/1984 | Luchi | 374/129 |
| 4,456,919 | 6/1984 | Tomita et al. | 357/28 A |
| 4,496,609 | 1/1985 | McNeilly et al. | 427/55 |
| 4,564,416 | 1/1986 | Homma et al. | 156/617 SP |
| 4,607,591 | 8/1986 | Stitz | 118/666 |
| 4,698,486 | 10/1987 | Sheets | 250/492.2 |
| 4,728,389 | 3/1988 | Logar | 156/612 |
| 4,764,026 | 8/1988 | Powell et al. | 374/178 |
| 4,789,771 | 12/1988 | Robinson et al. | 219/405 |
| 4,821,674 | 4/1989 | deBoer et al. | 118/666 |
| 4,836,138 | 6/1989 | Robinson et al. | 118/666 |
| 4,854,727 | 8/1989 | Pecot et al. | 374/57 |
| 4,890,245 | 12/1989 | Yomoto et al. | 364/557 |
| 4,913,790 | 4/1990 | Narita et al. | 204/192.13 |
| 4,919,542 | 4/1990 | Nulman et al. | 374/9 |
| 4,969,748 | 11/1990 | Crowley et al. | 374/1 |
| 4,978,567 | 12/1990 | Miller | 428/157 |
| 4,984,902 | 1/1991 | Crowley et al. | 374/1 |
| 4,996,942 | 3/1991 | deBoer et al. | 118/666 |

(List continued on next page.)

FOREIGN PATENT DOCUMENTS

| | | |
|---|---|---|
| 0339279 A2 | 3/1989 | (EP) . |
| 0445596 A2 | 2/1991 | (EP) . |
| 0634785 A1 | 7/1994 | (EP) . |
| 0829784 A1 | 9/1997 | (EP) . |
| 2629912A | 5/1988 | (FR) . |
| 1-114727 | 10/1987 | (JP) . |
| 7-58039 | 3/1995 | (JP) . |

Primary Examiner—Jeffrie R. Lund
(74) Attorney, Agent, or Firm—Knobbe, Martens, Olson & Bear, LLP

(57) ABSTRACT

A method is provided for treating wafers on a low mass support. The method includes mounting a temperature sensor in proximity to the wafer, which is supported on the low mass support, such that the sensor is only loosely thermally coupled to the wafer. A temperature controller is programmed to critically tune the wafer temperature in a temperature ramp, though the controller directly controls the sensor temperature. A wafer treatment, such as epitaxial silicon deposition, is started before the sensor temperature has stabilized. Accordingly, significant time is saved for the treatment process, and wafer throughput improved.

17 Claims, 11 Drawing Sheets

U.S. PATENT DOCUMENTS

| | | | |
|---|---|---|---|
| 5,002,630 | 3/1991 | Kermani et al. | 156/345 |
| 5,011,789 | 4/1991 | Burns | 437/81 |
| 5,063,031 | 11/1991 | Sato | 422/245 |
| 5,098,198 * | 3/1992 | Nulman et al. | 374/121 |
| 5,156,461 | 10/1992 | Moslehi et al. | 374/121 |
| 5,205,871 | 4/1993 | Godbey et al. | 148/33.3 |
| 5,221,412 | 6/1993 | Kagata et al. | 156/612 |
| 5,225,245 | 7/1993 | Ohta et al. | 427/248.1 |
| 5,359,693 | 10/1994 | Nenyei et al. | 392/418 |
| 5,373,806 | 12/1994 | Logar | 117/106 |
| 5,377,126 | 12/1994 | Flik et al. | 364/357 |
| 5,445,675 | 8/1995 | Kubodera et al. | 118/719 |
| 5,446,825 | 8/1995 | Moslehi et al. | 392/416 |
| 5,471,947 | 12/1995 | Southworth et al. | 117/94 |
| 5,514,439 | 5/1996 | Sibley | 428/64.1 |
| 5,549,756 | 8/1996 | Sorensen et al. | 118/715 |
| 5,551,985 * | 9/1996 | Brors et al. | 118/725 |
| 5,578,521 | 11/1996 | Suzuki et al. | 437/112 |
| 5,593,608 | 1/1997 | Suzuki | 219/491 |
| 5,650,082 | 7/1997 | Anderson | 219/390 |
| 5,678,989 | 10/1997 | Okase | 432/241 |
| 5,707,146 | 1/1998 | Gaus et al. | 374/1 |
| 5,743,644 | 4/1998 | Kobayashi et al. | 376/126 |
| 5,809,211 | 9/1998 | Anderson et al. | 392/416 |
| 5,902,407 * | 5/1999 | DeBoer et al. | 118/725 |
| 5,968,587 | 10/1999 | Frankel | 427/8 |
| 6,001,175 * | 12/1999 | Maruyama et al. | 117/102 |
| 6,053,982 * | 4/2000 | Halpin et al. | 118/728 |
| 6,086,680 * | 7/2000 | Foster et al. | 118/725 |
| 6,191,399 * | 2/2001 | Van Bisen | 219/497 |

* cited by examiner

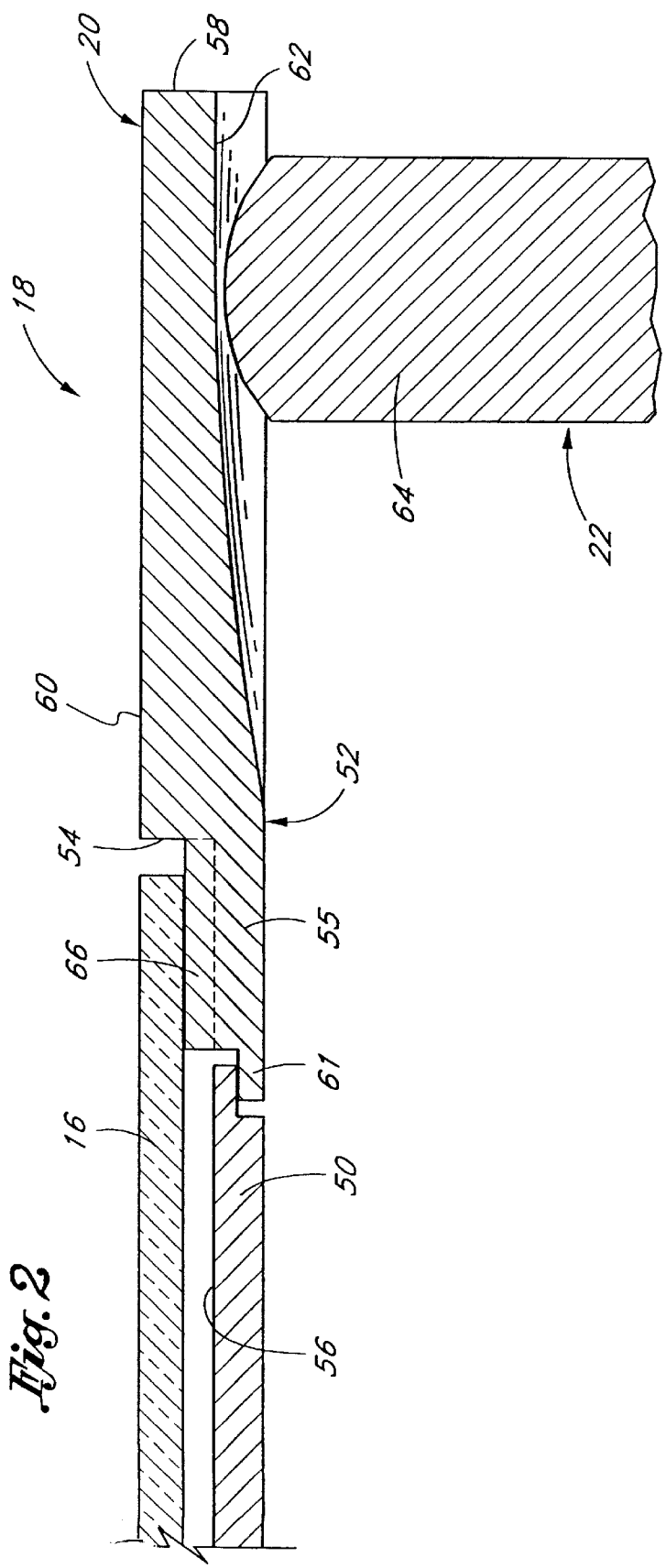

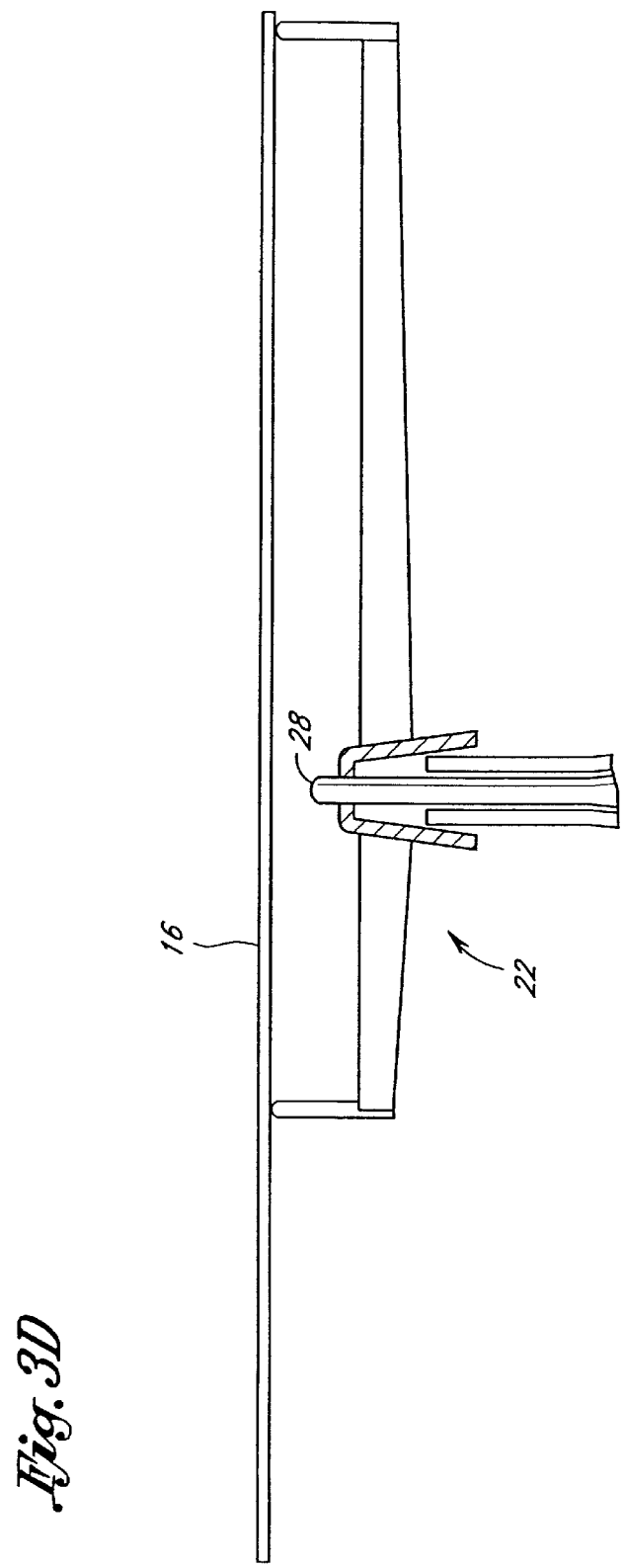

METHOD OF PROCESSING WAFERS WITH LOW MASS SUPPORT

REFERENCE TO RELATED APPLICATION

The present application is a divisional of U.S. application Ser. No. 09/184,491, filed Nov. 2, 1998.

This application claims the priority benefit under 35 U.S.C. § 119(e) from provisional Application No. 60/064,566 of van Bilsen et al., filed Nov. 3, 1997.

FIELD OF THE INVENTION

The present invention relates to processing substrates in semiconductor processing chambers, and more particularly to a method of increasing throughput for process steps at controlled temperatures.

BACKGROUND OF THE INVENTION

High-temperature ovens, called reactors, are used to create structures of very fine dimensions, such as integrated circuits on semiconductor substrates. One or more substrates, such as silicon wafers, are placed on a wafer support inside the reaction chamber. Both the wafer and support are heated to a desired temperature. In a typical wafer treatment step, reactant gases are passed over the heated wafer, causing the chemical vapor deposition (CVD) of a thin layer of the reactant material on the wafer. If the deposited layer has the same crystallographic structure as the underlying silicon wafer, it is called an epitaxial layer. This is also sometimes called a monocrystalline layer because it has only one crystal structure. Through subsequent processes, these layers are made into integrated circuits, with a single layer producing from tens to thousands or even millions of integrated devices, depending on the size of the wafer and the complexity of the circuits.

Various process parameters must be carefully controlled to ensure the high quality of the resulting layers. One such critical parameter is the temperature of the wafer during each treatment step of the processing. During CVD, for example, the deposition gases react at particular temperatures and deposit on the wafer. If the temperature varies across the surface of the wafer, uneven deposition of the reactant gas occurs. Accordingly, it is important that wafer temperature be stable and uniform at the desired temperature before the treatment begins.

Similarly, non-uniformity or instability of temperatures across a wafer during other thermal treatments can affect the uniformity of resulting structures. Other processes for which temperature control can be critical include oxidation, nitridation, dopant diffusion, sputter depositions, photolithography, dry etching, plasma processes, and high temperature anneals.

In certain batch processors (i.e., reactors which process more than one wafer at a time), a plurality of wafers are placed on a relatively large-mass susceptor made of graphite or other heat-absorbing material to help the temperature of the wafers remain uniform. In this context, a "large-mass" susceptor is one which has a large thermal mass relative to the wafer. The thermal mass of a solid, or its lumped thermal capacitance, is given by the equation:

$$C_T = \rho V c$$

where:

$\rho$ = the density of the solid,

V = the volume of the solid, and c = the specific heat (heat capacity) of the solid.

Thus, the thermal mass is directly related to its mass, which is equal to the density times volume, and to its specific heat.

One example of a large-mass susceptor is shown in U.S. Pat. No. 4,496,609 issued to McNeilly, which discloses a CVD process wherein the wafers are placed directly on a relatively large slab-like susceptor and maintained in intimate contact to permit a transfer of heat therebetween. The graphite susceptor supposedly acts as a heat "flywheel" which transfers heat to the wafer to maintain its temperature uniform. The goal is to reduce transient temperature variations around the wafer that would occur without the "flywheel" effect of the susceptor. Despite use of a large-mass susceptor, however, maintenance of uniform conditions across several wafers in a batch process remained difficult.

In recent years, single-wafer processing of larger diameter wafers has grown for a variety of reasons, including the greater precision with which process parameters can be monitored and controlled, as compared to batch-processing. Typical wafers are made of silicon with one common size having a diameter of 200 mm and a thickness of 0.725 mm, though smaller wafers (e.g., 100 mm, 125 mm, 150 mm) have also been used. Recently, larger silicon wafers having a diameter of 300 mm and a thickness of 0.775 mm have been proposed, as they even more efficiently exploit the benefits of larger single-wafer processing. Even larger wafers are contemplated for the future.

An example of a single-wafer reactor is shown in U.S. Pat. No. 4,821,674, which includes a circular rotatable susceptor having a diameter slightly larger than the wafer. Though such a susceptor has a lower thermal mass than the aforementioned slab-type batch processing susceptor, the thermal mass of the susceptor remains large compared to the thermal mass of the wafer.

One way in which process control is improved with single-wafer processing is by the ability to measure and control the temperature at various positions about the single wafer, which is impractical to perform for each of a batch of wafers. A plurality of temperature sensors, such as thermocouples or pyrometers, measure the temperature at various points surrounding the wafer. For example, one thermocouple can be placed near the leading edge of the wafer (the edge closest to the inlet for reactant gases), one near the trailing edge, one at a side, and one directly below the wafer. Temperature data from the thermocouples is sent to a temperature controller, which analyzes the data and adjusts the power output of a plurality of heat sources to keep the temperature at these various points uniform and at the desired level. The heat sources are typically radiant heating elements, or lamps, which have the advantage of rapid response to the controller.

Improved process control by single-wafer processing, however, comes at the expense of sharply reducing the number of wafers which can be processed in a given length of time (i.e., process throughput), as compared to batch processing. Since wafers can be processed only one at a time, any reduction of process time will significantly improve wafer throughput for single-wafer reactors.

One factor which critically affects throughput is the speed with which the wafer temperature can be ramped. Such temperature ramping can be required at several points in a given process. For example, a cold wafer must be heated to the appropriate treatment temperature. The process itself may also require different temperatures for different treatment steps. At the end of a process, the wafer ordinarily must be cooled to a level which the wafer handling device can tolerate.

More recently, it has been suggested that processing times can be reduced by using wafer holding fixtures of lower thermal mass than that of conventional susceptors. U.S. Pat. No. 4,978,567 describes such a low mass wafer holding fixture. The lower thermal mass of the wafer holder/wafer combination facilitates rapid heating and cooling of the wafer for Rapid Thermal Processing (RTP) systems. Throughput can also be increased in connection with other processes involving heating or cooling of a substrate to be processed.

Despite advancements in the design of single-wafer reactors and low mass wafer holding fixtures, heating and cooling steps continue to represent a significant percentage of processing time and a limitation on the attainable level of throughput. Consequently, there remains a need for reduced temperature ramp times.

SUMMARY OF THE INVENTION

In accordance with one aspect of the invention, a method is provided for processing a wafer in a semiconductor processing chamber. The wafer is placed on a wafer holder within the chamber. The temperature of a temperature sensor in proximity to the wafer holder is measured and controlled by a temperature controller. The temperature of the sensor is changed toward a first stable temperature, while the temperature of the wafer is changed to a second stable temperature faster than the sensor temperature is changed.

In accordance with another aspect of the invention, a method is provided for processing a wafer in a semiconductor processing chamber. The wafer is placed on a wafer holder, and the temperature of at least one temperature sensor in proximity to the wafer holder is measured. The temperature of the sensor is changed with a controller in response to a controller setpoint curve and a sensor offset term. A wafer treatment is started at a steady state temperature before the sensor reaches a stable temperature.

In accordance with another aspect of the invention, a method is provided for treating a wafer in a semiconductor processing chamber. The method includes placing the wafer in proximity to a temperature sensor within the reaction chamber. A wafer treatment is then started at a stable wafer temperature while the temperature of the sensor is still ramping.

In accordance with another aspect of the invention, a method of ramping a wafer to a stable temperature within a ramp time is provided. The method comprises using a PID controller to control the temperature of a temperature sensor loosely thermally coupled to the wafer.

In accordance with another aspect of the invention, a semiconductor processing apparatus is provided. The apparatus comprises a processing chamber having a support structure therein for supporting a wafer. A plurality of heating elements are arranged to heat the wafer. The apparatus also includes a temperature sensor which would be loosely thermally coupled to the wafer, when the wafer is supported within the processing chamber. The temperature sensor connects to a temperature controller, which is in turn connected to at least one of the heating elements. The controller controls the temperature of the sensor during a temperature ramp.

Advantageously, the preferred method provides significant time savings over previous methods by beginning a treatment process such as, for example, by flowing deposition reactant gases while the temperature sensor is still heating up. The concept is equally applicable to procedures which must await cool-down to a particular temperature, since the wafer supported by a low mass wafer holder will reach the desired steady state temperature while the temperature sensors are still cooling down.

BRIEF DESCRIPTION OF THE DRAWINGS

FIG. 2 is a partial, schematic sectional view of the wafer and support structure of FIG. 1;

FIG. 3D is a sectional view of a wafer supported without a wafer holder;

DETAILED DESCRIPTION OF THE PREFERRED EMBODIMENT

Exemplary System

Figure 1:
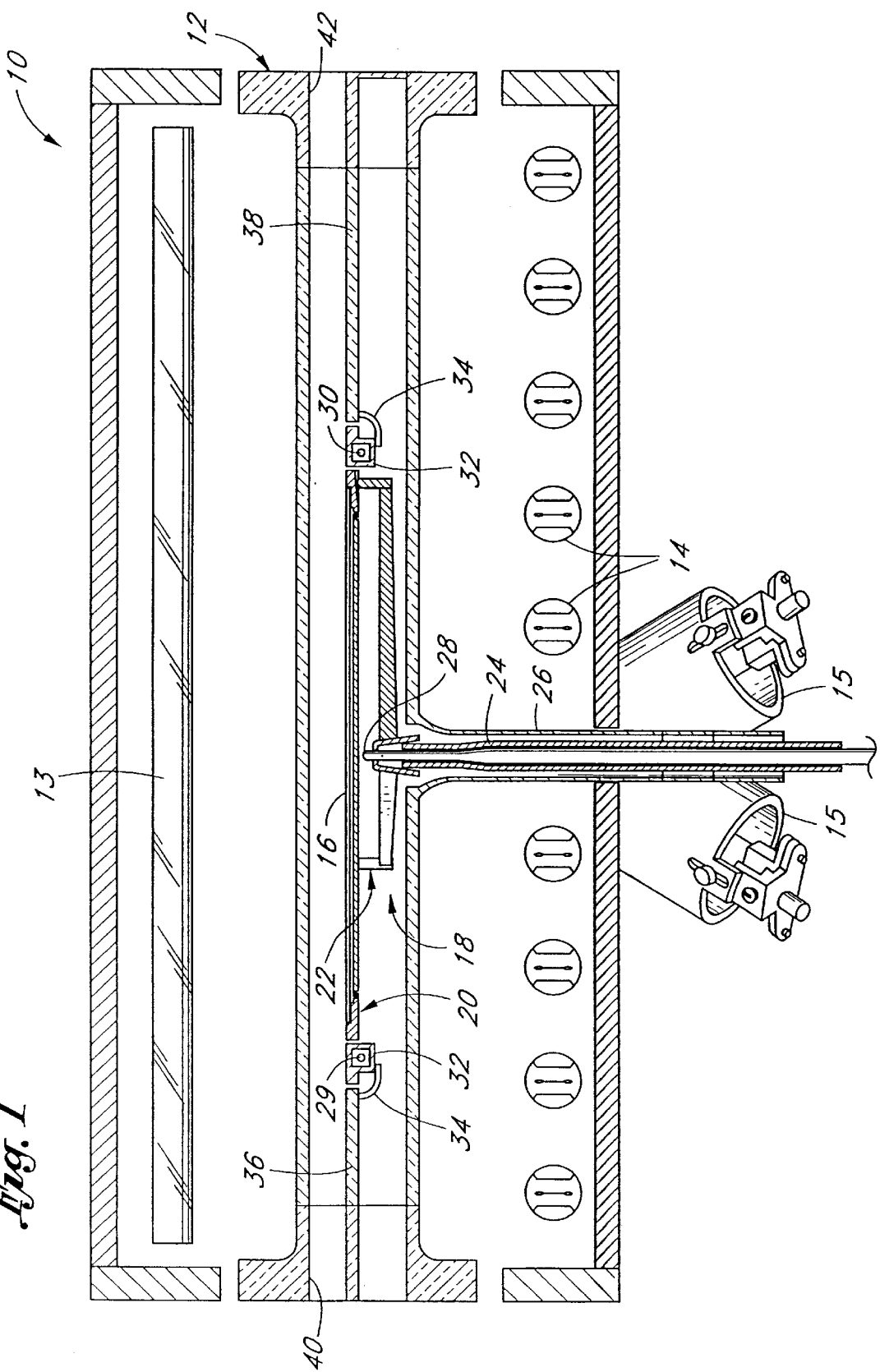
FIG. 1 is a schematic sectional view of an exemplary reaction chamber with a wafer supported therein by a support structure constructed in accordance with a preferred embodiment of the present invention.

FIG. 1 illustrates an exemplary chemical vapor deposition (CVD) reactor 10, including a quartz reaction chamber 12. A plurality of radiant heat sources are supported outside the chamber 12, to provide heat energy to the chamber 12 without appreciable absorption by the quartz chamber 12 walls. While the preferred embodiments are described in the context of a "cold wall" CVD reactor for processing semiconductor wafers, it will be understood that the processing methods described herein will have utility in the context of reactors of other types. In particular, one of skill in the art can find application for the methods described herein for other semiconductor processing equipment, wherein a semiconductor substrate is to be treated at a controlled temperature. The present invention can also be implemented in conjunction with other heating/cooling systems, such as those employing inductive or resistive heating. Moreover, precise temperature control is often required in the treatment of other substrates, including, without limitation, the deposition of optical thin films on glass or other substrates.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Additionally, a plurality of spot lamps 15 supply concentrated heat to the underside of the wafer support structure (described below), to counteract a heat sink effect created by cold support structures extending through the bottom of the reaction chamber 12.

Desirably, a portion of the radiant heat is diffusely reflected into the chamber 12 by rough specular reflector plates above and below the upper and lower lamps 13, 14, respectively. In some arrangements, the heating assemblies may include curved focusing reflectors to focus the radiant energy from some heating elements. For example, energy from peripheral heating elements in an upper heating chamber may be focused downward upon a temperature compensation ring, to compensate for peripheral heat losses at wafer edges, while central heating elements diffusely heat the wafer. U.S. Pat. No. 4,975,561, issued to Robinson, discloses such radiant heat focusing elements. Other reflectors can be disposed outside all sides of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors, as is described in more detail with respect to the temperature control system.

In the illustrated reactor 10, the upper heating assembly includes nine upper heating elements 13 of about 6 kW maximum power. The lower heating assembly includes eight lower heating lamps 14 of about 6 kW maximum power, as well as four spot lamps 15 of about 1 kW maximum power. Accordingly, the maximum power of the illustrated single wafer processing reactor 10 is about 106 kW. It will be understood that other reactors may have greater or lesser power capacity. In particular, batch processors generally have a much greater capacity for heating the mass of a number of wafers simultaneously.

A wafer 16 is shown supported within the reaction chamber 12 upon a wafer support structure 18, constructed in accordance with a first preferred embodiment of present invention. The illustrated support structure 18 includes a wafer holder 20, upon which the wafer 16 rests, and a support spider 22. The spider 22 is mounted to a shaft 24, which extends downwardly through a tube 26 depending from the chamber 12 lower wall.

A plurality of temperature sensors are positioned in proximity to the wafer 16. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of a position in proximity to the wafer.

In the illustrated embodiment, the temperature sensors comprise thermocouples, including a first or central thermocouple 28, suspended below the wafer holder 20 in any suitable fashion. As is known, thermocouples directly supply a voltage, which serves as an indicator of temperature. The illustrated central thermocouple 28 passes through upon the spider 22 in proximity to the wafer holder 22. The reactor 10 further includes a plurality of secondary or peripheral thermocouples, also in proximity to the wafer 16, including a leading edge or front thermocouple 30, a trailing edge or rear thermocouple 31, and a side thermocouple 31 (FIG. 3). Each of the peripheral thermocouples are housed within a slip ring 32 which surrounds the wafer holder 20 and wafer 16.

Each of the central and peripheral thermocouples are connected to a temperature controller (see FIG. 3), which sets the power of the various heating elements 14 in response to the readings of the thermocouples. The thermocouples and the temperature controller are discussed in more detail below.

In addition to housing the peripheral thermocouples, the slip ring 32 absorbs radiant heat during high temperature processing, such that heat will flow toward the wafer 16 edges. This compensates for a tendency toward greater heat loss at wafer edges, a phenomenon which is known to occur due to a greater ratio of surface area to volume in regions near such edges. By minimizing edge losses and the attending radial temperature non-uniformities across the wafer 16, the slip ring 32 can reduce the risk of crystallographic slip. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz.

The illustrated reaction chamber 12 includes an inlet port 40 for the injection of reactant and carrier gases. An outlet port 42 is on the opposite side of the chamber 12, with the wafer support structure 18 positioned between the inlet 40 and outlet 42.

Low Mass Wafer Holder

The method of processing described herein has particular utility for processing with low mass wafer holders. "Low mass" wafer holders refers to wafer holders having a thermal mass, as defined in the "Background" section above, comparable to that of the substrate to be supported, such that the temperatures of the wafer and wafer holder can be changed fairly quickly during heating and cooling processes. Preferably, the thermal mass of the wafer holder is less than about five times, more preferably less than about three times, and particularly between about 0.5 and two times the thermal mass of the substrate. The illustrated wafer holder 20 has a thermal mass about 1.7 times the thermal mass of the 200 mm wafer 16 shown. The portion of the illustrated wafer holder 20 which underlies the wafer has a thermal mass of about 1.4 times the thermal mass of the 200 mm wafer 16. It will be understood that such thermal mass ratios can be approximately maintained for wafer holders for supporting wafers of other sizes.

The wafer holder 20 may comprise any of a number of suitable materials of consistent density, such as have been utilized in the past for susceptors. As the low mass holder 20 will generally be thin, however, a material exhibiting high strength is desirable. In particular, silicon carbide (SiC) is a preferred material which exhibits high strength, the ability to withstand high temperature cycling, typical CVD process gases, and can be provided with consistent density for uniform thermal properties. The purity with which a thin SiC wafer holder can be provided is also advantageous in preventing contamination of the reaction chamber 12 through normal use.

FIG. 2 schematically shows a peripheral portion of the preferred wafer 16 and wafer support structure 18. The wafer holder 20 of the first preferred embodiment comprises a central base plate 50 supported by a peripheral ring 52. The ring 52 is defined by an inner wall 54, extending vertically from above an upper surface of an inner annular ring shelf 55, and an outer wall 58, and an upper surface 60 extending between the inner and outer walls. The base plate 50 is supported by an annular step 61, extending radially inwardly from the ring shelf 55. The two-piece design advantageously relieves stresses from thermal cycling, such as thermal gradients created by dropping a cold wafer upon a hot wafer holder.

A bottom surface of the ring 52 includes a plurality of recesses 62 (one shown), each of which cooperates with a spider post 64 for coupling the wafer holder 20 with the spider 22. For example, three recesses 62, circumferentially distributed with radial symmetry at 120° intervals about the circumference of the wafer holder 20, cooperate with three spider posts 64 which are similarly distributed. The recesses 62 are shaped to constrain the posts 64 to movement in the radial direction in response to differential thermal expansion of the wafer holder 20 relative to the spider 22. The recesses 62 and posts 64 thereby provide a self-centering mechanism for the support structure 18.

The wafer holder 20 further includes at least one and preferably a plurality of spacers or lips 66 (only one of which is shown) which directly support the wafer 16 upon the wafer holder 20. Desirably, the lips 66 are integrally formed with the surfaces of the wafer holder 20 from which they extend. Although a single, annular lip can be provided, six discrete lips 66 are preferred for supporting a 200 mm wafer, positioned with radial symmetry to peripherally support the wafer 16. Preferably, the width of each lip 66 is between about 0.5 and 1.5 mm, to provide stability for supporting the wafers while minimizing any disturbance to the wafer's thermal behavior.

The height of the lips 66 define a gap between the wafer 16 and the base plate 50. The lips 66 preferably extend above the base plate 50 a height of between about 0.005 and 0.080 inch, and more preferably between about 0.010 and 0.030 inch. The lips 66 of the illustrated embodiment are about 0.020 inch (500 microns) high. When the wafer 16 rests upon the lips 66, a gap of 0.020 inch is thus created between the wafer 16 and the base plate 50.

The wafer-base plate gap created by the preferred lips 66 advantageously balances a dampening effect on the thermal gradients created by cold wafer drop-off, while keeping the wafer 16 and wafer holder 20 thermally coupled during temperature ramping. It will be understood that the illustrated gap is optimal for the illustrated low mass SiC wafer holder, dimensioned to support a 200 mm silicon wafer. One of skill in art will recognize that other gap sizes will achieve the desired balance for other arrangements.

In order to provide the advantages of a low mass wafer holder, the thickness of the base plate 50 is desirably close to that of the wafer 16 to be processed. Accordingly, the base plate 50 preferably has a thickness between about 0.005 and 0.070 inch, and more preferably between about 0.010 and 0.040 inch. Typical 200 mm wafers have a thickness of about 0.029 inch. The base plate 50 of a wafer holder designed to hold a 200 mm wafer is thus between about 0.025 and 0.032 inch. The illustrated base plate 50 has a thickness of about 0.0285 inch. In contrast, a wafer holder 20 designed for receiving a 300 mm wafer desirably has a base plate 50 thickness of about 0.0305 inch. It will be understood that the thickness will be otherwise to maintain the desired thermal mass ratio for wafers of other sizes.

The thickness of the peripheral ring 52, as measured by the length of the outer wall 58, is greater than the thickness of the base plate 50, as shown. Preferably, the peripheral portion of the wafer holder 20 is between about 1.2 and 3.0 times as thick as the base plate 50, and more preferably the ring 52 is about 2 times as thick as the base plate. For the illustrated embodiment, the ring 52 has a thickness of about 0.077 inch, whereas the base plate 50 has a thickness of about 0.0285. The high surface area of the peripheral ring 52 absorbs radiant heat while the higher mass holds the heat and thus compensates for greater heat losses at the edge of a wafer during processing. The ring 52 thus supplements the edge loss compensation function performed by the slip ring 32 (FIG. 1).

Temperature Control System

Figure 3A:
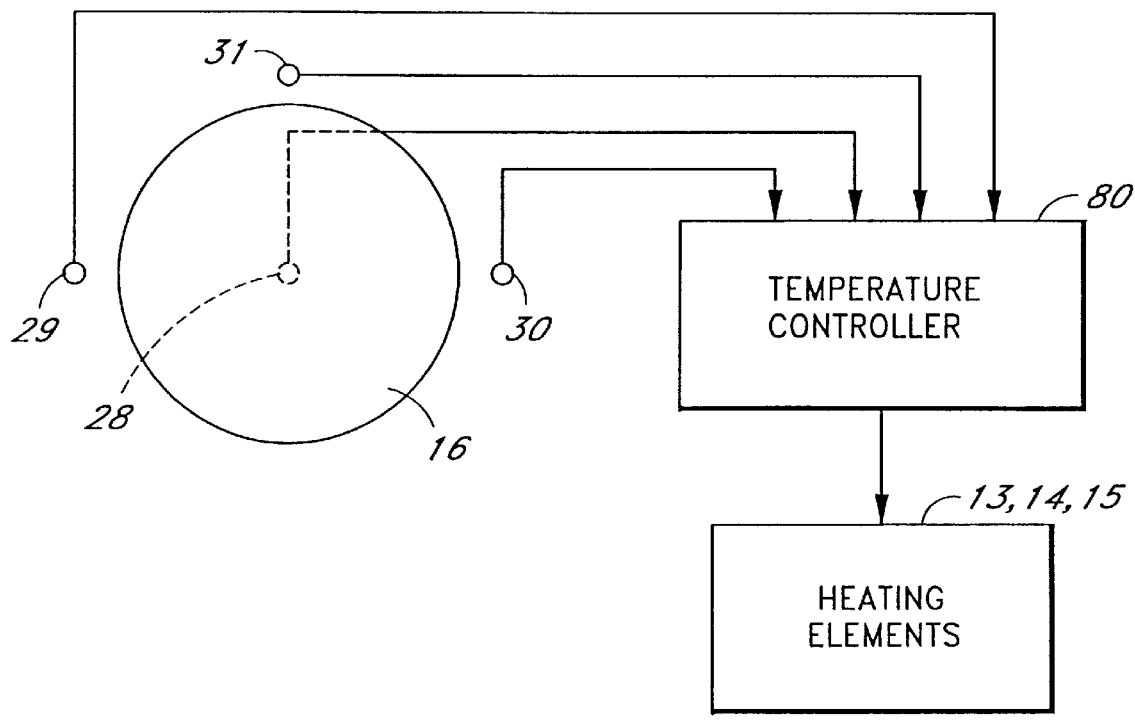
FIG. 3A is a schematic plan view of the wafer in relation to a plurality of temperature sensors and a temperature controller.

With reference to FIG. 3A, the wafer 16 is shown in relation to a plurality of temperature sensors, each connected to a temperature controller 80. While illustrated schematically as a single temperature controller 80, the preferred embodiment utilizes four independent temperature controllers for directly controlling the temperatures at four separate temperature sensors. It will be understood by one of skill in this art, however, that the invention can be applied to reactors with any of a number of temperature controllers, such as that disclosed in U.S. patent application Ser. No. 08/791,134, filed Jan. 30, 1997, entitled MODEL-BASED PREDICTIVE CONTROL OF THERMAL PROCESSING. Such a temperature controller can predictively control the temperature of a temperature sensor without being limited by the response time of the sensor.

The preferred temperature controller 80, however, comprises four independent PID controllers corresponding to the four independent temperature sensors. In the preferred embodiment, the temperature sensors comprise the thermocouples 28–31, which indirectly measure temperature by gauging a voltage across a pair of wires forming a junction, as is know in the art of temperature measurement. The Proportional, Integral, and Differential terms are set for each of the PID controllers by a reactor technician. Such controllers are available from Foxboro under the designation 761 CNA single station micro-controller.

Ideal Wafer Temperature or Setpoint

The technician chooses a "setpoint" (e.g., the temperature-time curve which the wafer 16 is ideally to follow). The setpoint generally includes a flat plateau or valley at a stable temperature at which processing is to be conducted. Such a plateau or valley will be referred to herein as a "setpoint treatment temperature." Computer software or the technician selects the P, I and D terms for each of the temperature sensors to adjust the slope of the temperature curves to critically tune the system for efficiently reaching the desired treatment temperature.

"Critically tuned" conventionally defines a temperature-time slope or ramp rate for which a temperature sensor reaches a desired temperature as quickly as possible without overshooting the desired temperature. If too much power is delivered, the sensor will overshoot the desired temperature and require additional time to return to the desired temperature. Even then, the temperature sensor could cool too much, such that the power is again turned on when this is sensed, and a slight overshoot again occurs. The oscillations will decrease in size and the temperature sensor will eventually reach stability, but after a significant amount of time has elapsed. Critically tuning avoids overshooting and thus generally brings the temperature sensor to the desired temperature, and keeps the temperature sensor stable at that temperature, more quickly than a faster ramp rate could.

Figure 3B:
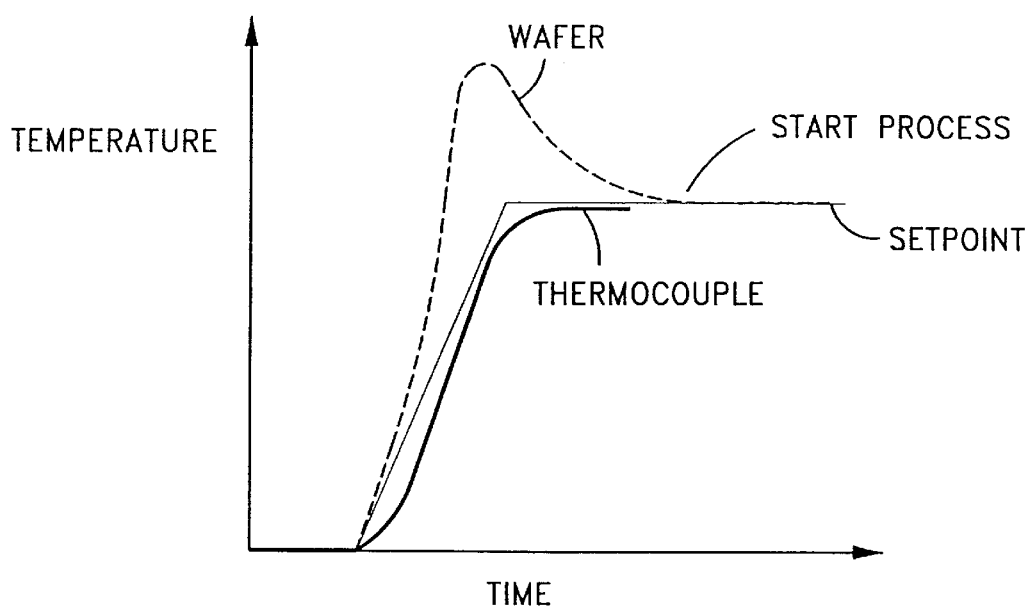
FIG. 3B is a model plot of a temperature ramp in which the temperature sensor is critically tuned, while the wafer overshoots its targeted temperature.

As shown in FIG. 3B, however, where a low mass wafer holder is used, the temperature sensor will tend to be only loosely coupled (thermally) to the wafer. In such a situation, optimizing the PID controller for critically tuning the thermocouple temperature (such that the thermocouple does not overshoot) could result in a significant overshoot of the wafer temperature beyond the setpoint. Such a result is undesirable, as it takes too long to stabilize the wafer at the desired wafer temperature. Furthermore, overshooting can cause damage to a partially fabricated wafer (e.g., over-diffusing a dopant during a drive step).

Therefore, in accordance with the preferred embodiment, it is desirable to set the PID parameters which control the thermocouple temperature to values which optimize or critically tune the wafer temperature. It is difficult to directly measure the wafer temperature with accuracy during processing, for the preferred arrangement of the low mass wafer holder 20 and wafer 16. It has, however, been found that a temperature sensor (e.g., thermocouple) measuring temperature in close proximity to the wafer in a field of infra-red radiation can be dynamically related to the wafer temperature by a first order equation:

$$C_w \frac{\partial T_w}{\partial t} = q_w^i - q_w^o \quad (1)$$

where:

$$C_{tc} \frac{\delta T_{tc}}{\delta t} = q_{tc}^i - q_{tc}^o \quad (2)$$

$q_{tc}^i = k(T_w - T_{tc})$ (where first order heat transfer is assigned)
$q_{tc}^o = l = $ (constant) heat loss through the thermocouple,
k=the heat transfer rate between wafer and thermocouple $$\frac{C_{tc}}{k} \frac{\delta T_{tc}}{\delta t} = (T_w - T_{tc}) - \frac{l}{k} \quad (3)$$

$$\tau \frac{\delta T_{tc}}{\delta t} = T_w - T_{tc} - c \quad (4)$$

where:

$\tau = \dfrac{C_{tc}}{k} = $ the time constant of thermocouple/wafer coupling, $c = \dfrac{l}{k} = $ offset of the thermocouple.

These last two terms can be measured for a given system (e.g., the preferred arrangement illustrated in FIG. 1). For example, τ can be measured for a given system (i.e., wafer, temperature sensor, wafer support, chamber, heating system, dimensional and mass relationships among them, etc.) by performing a step function, or incremental increase in lamp power, and plotting the temperature against time for the temperature sensor until the sensor reaches a stable temperature. The time it takes for the sensor to reach 63% of the total temperature change is time constant τ. Given a particular setpoint $T_w$ (ideal wafer temperature as a function of time), the thermocouple (or other sensor) temperature $T_{tc}$ as a function of time can then be solved numerically. Note that the various temperature sensors 28–31 of the illustrated system have different relationships to the wafer 16, and thus are characterized by different sensor-wafer coupling constants τ.

Figure 3C:
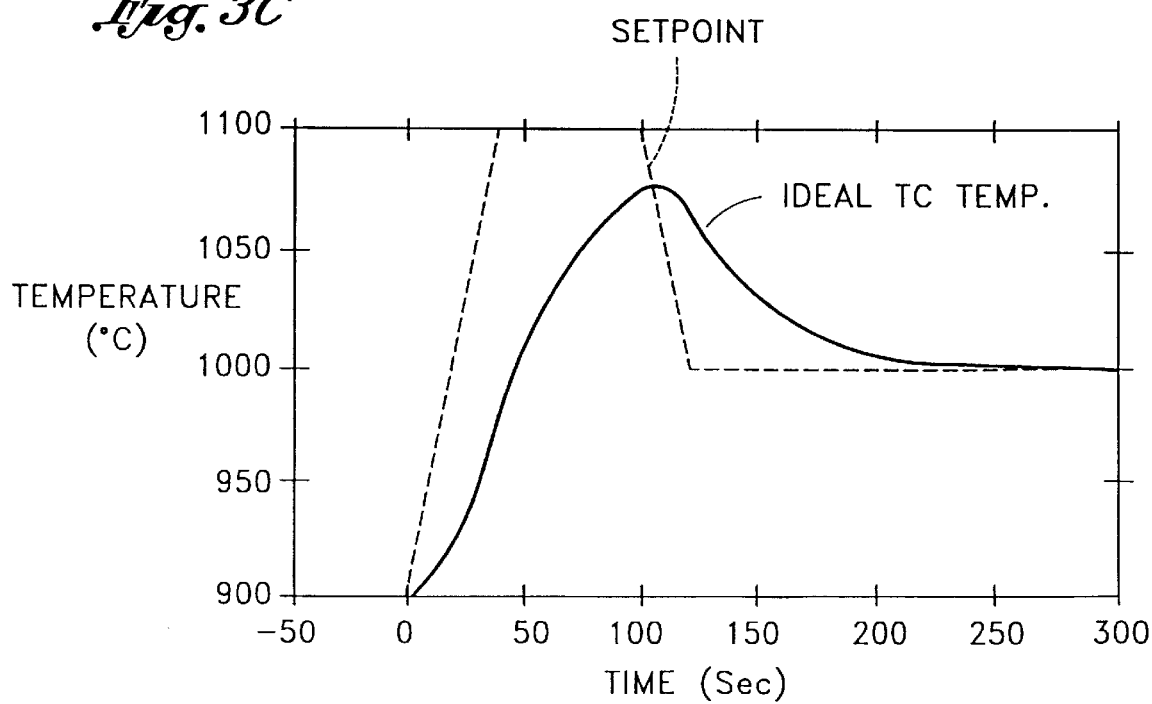
FIG. 3C is a plot of the temperature curve for a temperature sensor which is calculated to critically tune the wafer when the temperature sensor is loosely thermally coupled to the wafer.

FIG. 3C illustrates such a calculated ideal thermocouple curve to achieve a given wafer setpoint. Accordingly, setting a PID controller for the thermocouple curve shown results in critically tuning the wafer 16 supported by the preferred wafer holder 20, even though the thermocouples 28–31 are only loosely thermally coupled to the wafer. Because the wafer is critically tuned, the wafer temperature closely approximates the setpoint shown in FIG. 3C.

Loose thermal coupling, within the meaning of the present application, indicates a thermal relationship between a wafer and a temperature sensor for which thermal exchanges between the wafer and temperature sensor are slow enough that their coupling constant τ is not negligible in comparison to the ramp time at issue. In particular, a temperature sensor will be considered "loosely thermally coupled" to a wafer when their coupling time constant τ is greater than about 0.1 times the ramp time at issue. It will be understood that the "looseness" of thermal coupling tends to vary for the various temperature sensors within a system.

While close coupling is in general desirable for accuracy in indirectly monitoring the wafer temperature, looser coupling can be a by-product of reactor arrangements which are also desirable. Accordingly, the methods described herein preferably enable processing where τ is greater than about 0.3 times the ramp time, more preferably enabling processing with τ is greater than about 0.5 times the ramp time, even for processes in which precise wafer temperature control is important (e.g., epitaxial deposition). For processes in which greater leeway is available for temperature uniformity (e.g., post-silicidation anneals), the methods enable processing where τ is greater than about 0.8 times the ramp time.

Loose thermal coupling for the illustrated reactor arrangement can also be defined in terms of a spacing of greater than about 0.010 inch of the temperature sensor from a low mass wafer holder, as defined above. The methods described herein preferably enable processing where the spacing between the low mass wafer holder and the point at which temperature is sensed is greater than 0.020 inch, more preferably between about 0.030 inch and 0.070 inch. The temperature sensor desirably remains at least partially thermally coupled to the wafer, however, such that the spacing between the wafer holder and the temperature sensor should be less than about 1.0 inch.

The preferred method of temperature control does not require any wafer holder to assist in thermally coupling the wafer to a spaced temperature sensor. Accordingly, the method of control disclosed herein can be applied to a "zero mass" wafer holder, as illustrated in FIG. 3D. The wafer 16 is supported upon a spider 22, such as the spider 22, with no susceptor or other wafer holder between the wafer 16 and the walls of the cold wall reaction chamber (not shown). While the illustrated spider 22 has a non-zero mass in the conventional sense, it is constructed of material transparent to radiant heat (e.g., quartz) and so is considered a "zero mass" wafer holder in the sense that no wafer bolder is present which will appreciably absorb radiant heat and aid in thermally coupling the wafer to the temperature sensor.

Alternatively, the wafer can be supported within the reaction chamber without any spider. For example, the wafer can be supported upon a cushioning pressurized gas or flowing gas, with the temperature sensor spaced from the wafer. The methods of the present invention allow one to process wafers based upon the temperature readings of the temperature sensor, even though the sensor would be only loosely thermally coupled to the wafer. In this case, the wafer and temperature sensor could be considered loosely coupled with even a smaller spacing between the sensor and the wafer, since the supporting gas might act to thermally insulate the wafer from the sensor. If the supporting gas is sufficiently pressurized and thermally conductive, the system may be loosely coupled at a greater distance.

With a low mass wafer holder and the given heating system (which has a total maximum power output of about 104 kW), tuning the PID controllers in this manner has resulted in critically tuned wafer ramp rates of about 4 to 15° C./sec. Controlling with no wafer holder can give ramp rates higher than about 25° C./sec. Of course, one of skill in the art will readily recognize that these rates can be increased further with a heating system of a greater power capacity.

Figure 4:
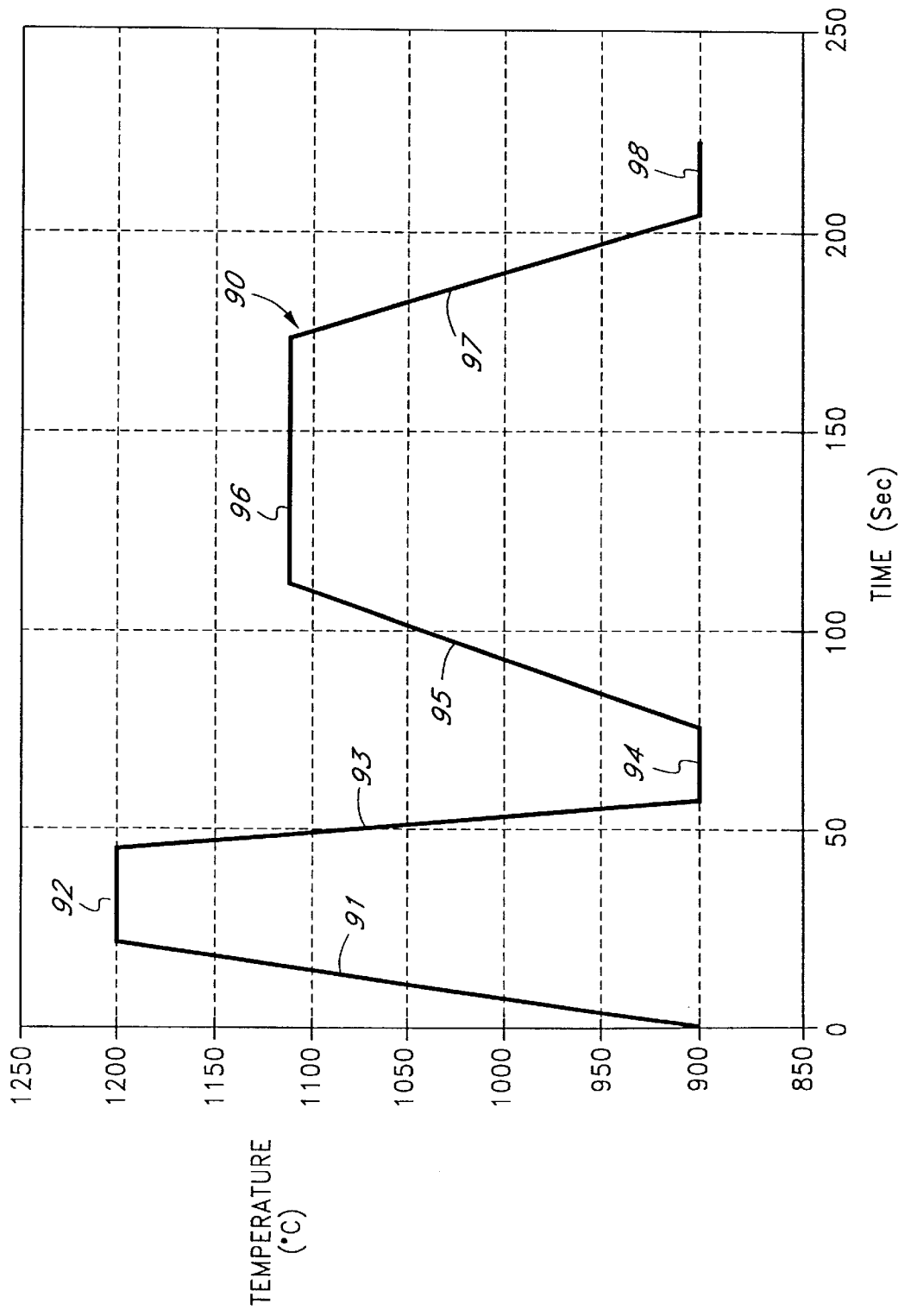
FIG. 4 is a plot of a setpoint or ideal temperature-time curve for an exemplary epitaxial deposition process.

FIG. 4 shows an exemplary wafer setpoint 90 for a particular process. The setpoint 90 includes the following segments, in sequence: a first heating or ramping up stage 91; a first setpoint treatment plateau 92; a first cooling or ramping down stage 93; an inter-treatment valley 94; a second heating or ramping up stage 95; a second setpoint treatment plateau 96; a second cooling or ramping down stage 97; and a second valley 98.

The illustrated setpoint 90 represents the ideal temperature-time curve for an epitaxial silicon CVD process. Accordingly, the first setpoint treatment plateau 92, at about 1200° C., represents a pre-loading etch step to clean the chamber of any residual contaminants. Hydrogen gas can be introduced for this step, as well as HCl vapor. In other arrangements, such as CVD processes other than epitaxial silicon deposition, nitrogen can also flow at this stage. Additionally, a lamp check procedure can be run, to ensure proper operation of the heating elements 13, 14, 15 prior to introducing the wafer. The wafer 16 (FIGS. 1 and 2) is then loaded into the reaction chamber 12 at the inter-treatment valley 94, at about 900° C. The second setpoint treatment plateau 96, at about 1120° C., represents the stage at which deposition of the silicon takes place. Accordingly, the deposition gases (e.g., silicon and dopant source gases, such as trichlorosilane, arsine, phosphine, etc.) are introduced to the reaction chamber 12 while the wafer 16 is at this setpoint treatment temperature 96. Finally, after cooling 97, the wafer 16 is to be unloaded at the temperature of the second valley 98, at which temperature the wafer handling device can handle the wafer 16.

Control of Thermocouple Temperatures

Referring again to FIG. 3A, in operation the temperature controller 80 directly controls the temperature of the four temperature sensors, which comprise the center thermocouple 28, the front thermocouple 29, the rear thermocouple 30, and a side thermocouple 31 in the illustrated embodiment. In response to signals indicative of temperature from each thermocouple, each the temperature controller 80 controls the power output of the various elongated heating elements 13, 14 and the spot lamps 15. The PID controller associated with each thermocouple dictates the power to be delivered in the particular heating zone associated with the thermocouple.

For example, if the front thermocouple 29 indicates that the temperature is not at its targeted temperature, the power output of front peripheral lower lamps 14 is adjusted accordingly. If the center thermocouple 28 indicates that the temperature is not at its targeted temperature, the spot lamps 15 and the central elongated lamps 13, 14 are adjusted accordingly.

Such control is maintained during temperature ramping steps, such as heating step 95 or cooling step 97 (FIG. 4), in accordance with the P, I and D terms selected for critically tuning. The temperature controller also maintains the wafer temperature (indirectly) at steady state, such as the setpoint treatment temperature 96 (FIG. 4). At steady state during deposition, for instance, introduction of deposition gases can upset the temperature of the steady state condition. Newly introduced deposition gases can alter the temperature at the front thermocouple 29 while depletion of the reactant species during deposition causes a different alteration of the temperature at the rear thermocouple 30. The temperature controller 80, using four independent PID controllers in conjunction with four independent thermocouples, adjusts for the changes to maintain the targeted temperatures at each thermocouple.

Steady State Offsets

The targeted temperatures at each thermocouple, however, do not exactly correspond to the setpoint 90 (FIG. 4), or uniform wafer 16 temperature sought. As the thermocouples 28–31 are each spaced from the wafer 16, the temperature sensed at the thermocouples 28–31 varies slightly from the temperature of the wafer 16. The degree of variation for each thermocouple 28–31 depends in part upon their respective spacings from the wafer 16.

In the illustrated embodiment, each of the peripheral thermocouples 29, 30, 31 is housed within the slip ring 32 (FIG. 1), with the tip of each thermocouple about 1.5 to 2 cm from the edge of the wafer 16. Each of the peripheral thermocouples can be conventional in design.

The illustrated center thermocouple 28 is mounted below the low mass wafer holder 20, extending through a hub of the spider 22, with the thermocouple 28 tip spaced from the base plate 50 (FIG. 2). The preferred thermocouple 28 has a protective SiC sheath over the thermocouple junction and a quartz cap between the thermocouple junction and the SiC sheath. The tip, including the protective sheath, has a radius of about 0.060 inch.

The preferred base plate 50, unlike prior art susceptors, is too thin to provide a recess for accommodating a thermocouple. A through hole is undesirable for the illustrated embodiment, as it would tend to induce backside deposition during CVD. Arranging the thermocouple tip to contact the base plate in order to obtain a reading as close as possible to the actual temperature of the wafer holder is also undesirable. Rotation of the wafer holder, vibrations, and/or thermal expansion could bring the thermocouple out of contact with the wafer holder in the midst of processing, radically changing the relation between the thermocouple reading and the wafer temperature.

Accordingly, the preferred wafer support structure 18 is arranged to space the tip of the center thermocouple 28 between about 0.030 and 0.070 inch from base plate 50 of the preferred wafer holder 20. Thermocouple readings, when the system is at thermal stability temperature, have been found to be substantially spacing-insensitive within this spacing range, such that slight movement of the thermocouple 28 during or between normal processing operations will not necessitate recalibration of the thermocouple-temperature controller system. Preferably, the initial spacing is in the midst of this range, about 0.040 and 0.060 inch, such that fluctuations during operation remain within the 0.030 to 0.070 inch range. Most preferably, the initial spacing is set at about 0.050 inch. One of skill in the art will recognize that the optimal center thermocouple-wafer support spacing range may differ for different thermocouple types, and for different wafer support strictures.

To account for the wafer-thermocouple loose thermal coupling and consequent temperature differentials, due in part to these spacings, each PID controller includes a temperature offset variable, which relates the targeted temperature at each thermocouple to the desired setpoint for the wafer temperature (e.g., epitaxial CVD setpoint 90 of FIG. 4). These offsets can be determined experimentally at a low steady state temperature using an instrumented wafer, as will be understood from the description of FIG. 5 below. Comparing the actual temperature of the wafer 16 to the thermocouple readings, for the preferred wafer support 18, slip ring 32, and thermocouple spacings, the center offset can be set at about 5° C., the front offset at about 20° C., the side offset at about 22° C., and the rear offset at about 35° C. It will be understood that, for other arrangements, different offsets can be experimentally determined.

Method of Processing

EXAMPLE I

General Case

Figure 5:
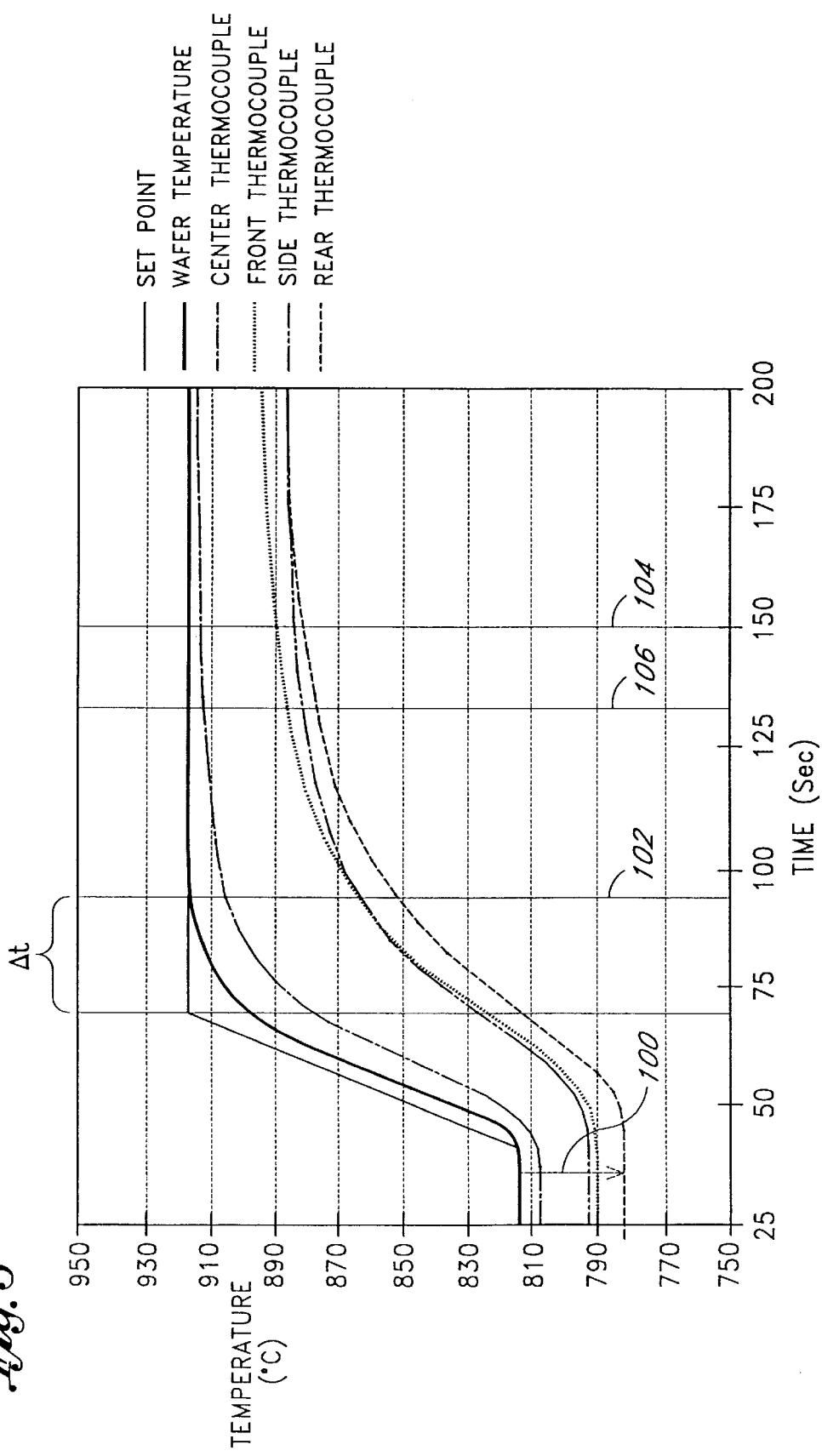
FIG. 5 is a graph of a temperature ramp conducted in accordance with a preferred method, plotting temperature on the abscissa and time on the ordinate axis.

Referring to FIG. 5, an exemplary temperature ramp and treatment is illustrated, using the preferred low mass wafer holder 20 (FIGS. 1 and 2) to support the wafer 16. The setpoint, wafer, center thermocouple, and peripheral thermocouple temperature-time curves are shown. Using the preferred low mass wafer holder 20, the wafer temperature closely follows the setpoint programmed into the PID controllers, while the thermocouples lag behind and have offset steady state temperatures. Significantly, the wafer 16 reaches a stable temperature at or near the setpoint an appreciable amount of time before the thermocouples reach a stable, parallel temperature.

Although FIG. 5 reflects real data with the low mass wafer holder 20, it will be understood that the graph represents the general relationship among the setpoint, wafer and thermocouple curves, regardless of the size (temperature difference) or direction (heating or cooling) of the ramp.

The illustrated ramp begins with the wafer 16 at a steady state temperature of about 813° C. and ends at a steady state temperature of about 915° C. The illustrated ramp thus increases the wafer temperature by a ramp size or temperature change ($\Delta T$) of about +100° C. in about 20–25 seconds. For purposes of the first example, it will be assumed that the illustrated ramp is to be used in conjunction with a hypothetical substrate treatment (e.g., CVD treatment) which is to take place at about 915° C.

The term "treatment," in the meaning of the present application, refers to any step or set of steps which is to be conducted at a stable, controlled temperature. It will be understood by one of skill in the art that the terms "stable," "controlled," or "steady state," in reference to temperature level, are treatment dependent and can often refer to a range of temperatures. For example, an epitaxial deposition treatment can take place satisfactorily within about ±3–4° C. of the target temperature. Polysilicon deposition, on the other hand, should be stable within about ±1° C. Implant activation can be satisfactorily performed within ±20–50° C. or even greater deviations from the target temperature. One of skill in the art of semiconductor processing can determine for each given treatment the required degree of temperature stability.

The treatment at a stable temperature is to be contrasted with the term "process," which as used herein includes the entire setpoint and associated procedures, from loading a wafer or batch of wafers into a reactor chamber until unloading the wafer or batch. While the general case will be discussed in terms of a hypothetical CVD treatment, it will be understood that a treatment may be a step in any of a number of different processes for which step a stable controlled temperature is required. For example, the treatment can simply consist of an anneal in the original inert environment (e.g., $H_2$ gas), in which case the wafer 16 should be stable at the desired temperature for a pre-determined period of time. In such a case, the beginning of the treatment is not defined by the introduction of reactant gases, but is rather defined merely by the point at which a technician begins timing the pre-determined period for the anneal.

The data of FIG. 5 was obtained using an instrumented wafer (not shown), constructed in any suitable manner, for directly measuring the wafer temperature during the ramp, while the thermocouple temperatures were, of course, directly measured. Instrumented wafers are known, in general, and have been used in the past for various calibration steps at lower temperatures. For example, temperature offsets for input into PID controllers can be obtained by directly measuring the temperature difference between the wafer 16 and the various thermocouples 28–31 at a low temperature steady state (e.g., while the wafer is at about 813° C. at reference numeral 100 prior to the illustrated ramp).

Such instrumented wafers, however, cannot be used at temperatures above about 1050° C. Furthermore, they obviously cannot be used during actual production, wherein integrated circuits or other structures are created on the substrate. During processing, the PID controller only knows the setpoint and the temperatures of the thermocouples. The actual wafer temperature is not directly measured during processing.

Accordingly, the end of a temperature ramp has conventionally been defined by the point at which one or more of the remote temperature sensors (e.g., thermocouples) indicate that their readings have stabilized. Either the reactor control computer or a technician monitored the thermocouples until they reached a stable temperature. At that point, the desired treatment could begin.

FIG. 5, by way of contrast, shows that, while ramping the wafer temperature in accordance with the preferred embodiment, the wafer temperature reaches stability at or near the setpoint treatment temperature before any of the thermocouple temperatures stabilize. Specifically, the wafer 16 reaches a stable temperature at a wafer stability time 102 (at about 94 seconds on the time scale of FIG. 5). At the wafer stability time 102, FIG. 5 clearly shows that the temperature of each of the thermocouples continues to climb. The first thermocouple to reach stability is the center thermocouple 28, and it does not reach stability, i.e., zero or flat temperature-time slope, until a center thermocouple stability time 104 (at about 150 seconds in the illustrated example), much later than the wafer stability time 102.

As illustrated, the peripheral thermocouples do not reach thermal stability until even later than the center thermocouple 28. In fact, the point of stability for the peripheral thermocouples 29, 30, 31 is so late that it cannot be shown on the scale of FIG. 5. In the illustrated ramp, the peripheral thermocouples 29, 30, 31 require between about 80 and 130 seconds to reach a stable temperature.

The hypothetical treatment thus begins at the wafer stability time 102 in the preferred embodiment, which is sooner than thermocouple stability time 104. The amount of time between wafer stability 102 and thermocouple stability 104 depends upon the size of the ramp and the spacing of the thermocouple from the wafer 16 and wafer holder 20. In general, the wafer temperature can reach stability more than about 5 seconds before the quickest thermocouple. Starting the treatment 5 seconds earlier than would be possible by monitoring the thermocouples represents a significant time savings for the total process. For preferred arrangements, the wafer stability time 102 precedes the thermocouple stability time 104 by more than about 25 seconds, and more preferably by more than about 40 seconds.

In the given example, wherein the wafer temperature need only be maintained at the treatment temperature for about 50 seconds, the treatment can be started and ended at a treatment end time 106 before any of the thermocouples reach stability. In other words, the treatment can be ended in accordance with the method of the preferred embodiment even before the thermocouples would indicate sufficient stability of the system to start the treatment.

Figure 6:
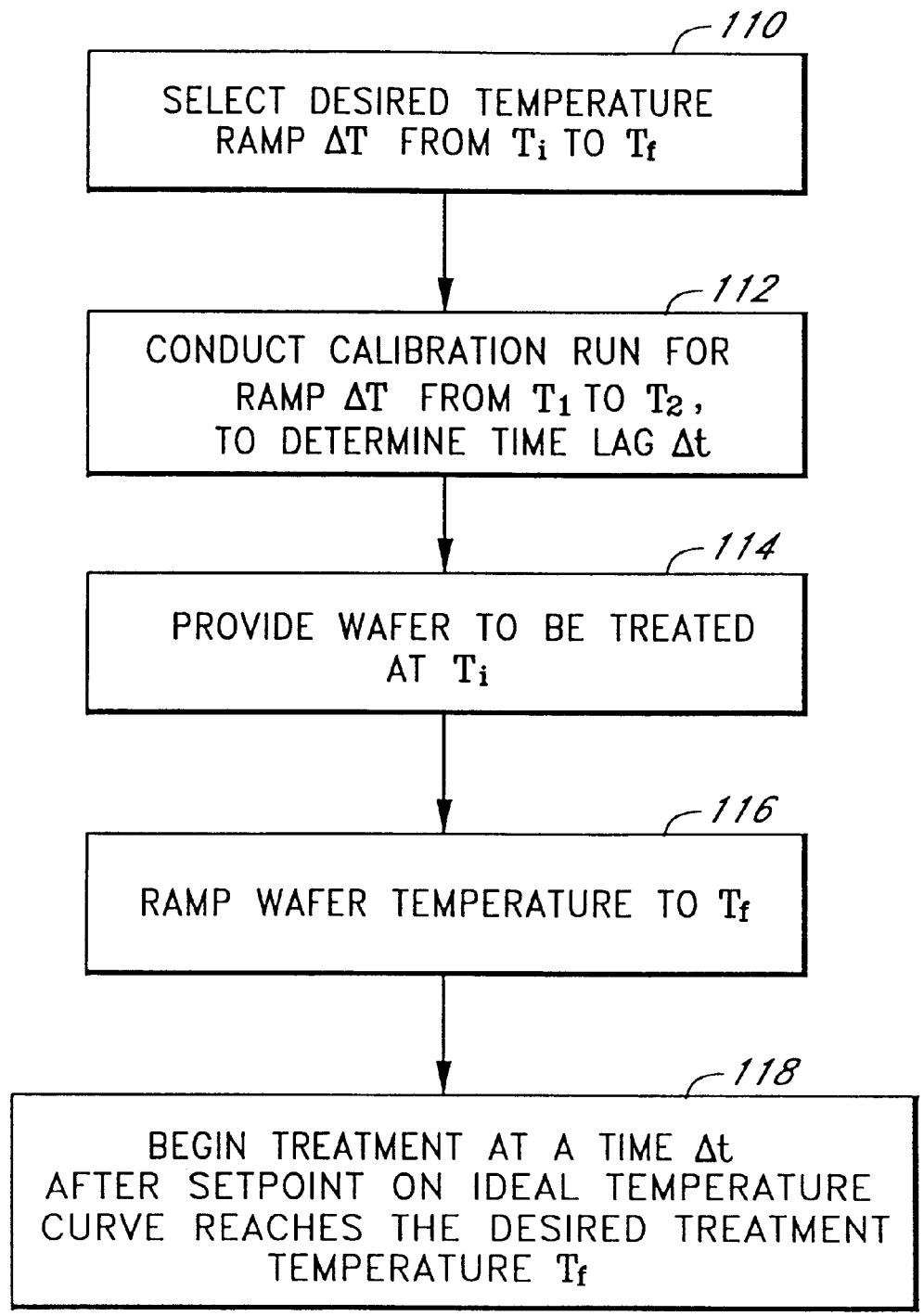
FIG. 6 is a flow chart showing generally the steps for treating wafers in accordance with the preferred method.

FIG. 6 illustrates a method for practical determination and application of the time savings provided by the preferred embodiment. The method involves determining a degree of time lag $\Delta t$ of the wafer behind the setpoint, for a given temperature ramp $\Delta T$. Using this time lag, the reactor can be set to begin treatment a certain time after the PID controller setpoint indicates stability should ideally be reached.

Initially, a desired temperature ramp ($\Delta T$, or change in temperature) is chosen 110, including the size and direction of the ramp. For example, the setpoint in FIG. 5 shows a desired ramp from an initial temperature $T_i$ of 813° C. to a final temperature $T_f$ of 915° C., gives a $\Delta T$ of about +102° C. It will be understood that cooling steps, in contrast, are attributed a negative $\Delta T$ by convention.

Next, a calibration run is conducted 112 for the selected $\Delta T$. FIG. 5, for example, can represent such a calibration run, using an instrumented wafer to determine the time lag $\Delta t$ of the wafer behind the setpoint for the selected $\Delta T$ from a chosen $T_1$ to a calculated $T_2=T_1+\Delta T$. In the example discussed herein, the calibration run can be conducted over the same range of absolute temperatures as the hypothetical treatment step, such that the initial temperature $T_i$ happens to equal $T_1$ and $T_f$ accordingly equals $T_2$.

In general, the time lag $\Delta t$ behind the setpoint is desirably less than about 25 seconds. For preferred arrangements, the time lag is less than about 10 seconds, more preferably less than about 5 seconds, and most preferably less than about 3 seconds. In the example illustrated in FIG. 5, the time lag $\Delta t$ behind setpoint is about 25 seconds.

Next, a non-instrumented wafer is provided 114 at the initial temperature $T_i$, during an actual (as opposed to calibration run) process in accordance with the chosen setpoint. As with the calibration run, the wafer temperature is ramped 116 by a temperature difference of $\Delta T$, which takes the wafer to the final or treatment temperature $T_f$.

Rather than monitoring the actual temperature of thermocouples, the reactor technician, or more likely a master computer in which the setpoint is input, monitors the setpoint and begins treatment 118 at a time $\Delta t$ after the setpoint reaches the treatment temperature. In the example of FIG. 5, deposition gases can be introduced to the reaction chamber 12 (FIG. 1) about 25 seconds after the setpoint reaches the treatment temperature. After this amount of time lag $\Delta t$ behind setpoint, it is known from the calibration run that the wafer will have reached a steady state at or near the treatment temperature. Since the setpoint is an ideal, pre-programmed temperature-time curve, the time to begin treatment 118 can likewise be pre-programmed. Advantageously, treatment can begin 118 much earlier than the point at which any thermocouple reaches equilibrium.

It will be understood, in light of the disclosure herein, that in some situations a wafer ramped on a low mass susceptor may lag so closely behind the setpoint, that the wafer temperature is effectively stable at the treatment temperature as soon as the setpoint reaches stability. Such can be the case for small temperature ramps and/or temperature insensitive treatments. For example, epitaxial deposition with silane, within the range of 900° C. to 1,000° C., is relatively temperature insensitive. Furthermore, ramps for such a treatment from 900° C. are relatively short, such that the time lag $\Delta t$ is likewise short. Other processes for which no time lag is required include an anneal in an inert environment, or a cooling step before unloading. See, for example, stages 92 and 98 of FIG. 4 and the accompanying text.

EXAMPLE II

High Temperature Process

In the above-noted hypothetical example, wherein the highest temperature for the actual process does not exceed the limits of an instrumented wafer (currently about 1050° C.), the calibration run can be identical to the actual process, with the exception that an instrumented wafer is used. Thus, $T_i=T_1$ and $T_f=T_2$. Where the process includes temperatures exceeding the limits of the instrumented wafer, such a calibration is not possible.

It has been found, however, that a given temperature ramp $\Delta T$ has a generally constant time lag $\Delta t$, regardless of the initial and final temperatures $T_i$, $T_f$ of the ramp. Accordingly, the calibration run can be conducted wherein $T_i \neq T_1$ and $T_f \neq T_2$, such that the calibration can be conducted at a lower temperature range which the instrumented wafer can withstand.

Figure 7A:
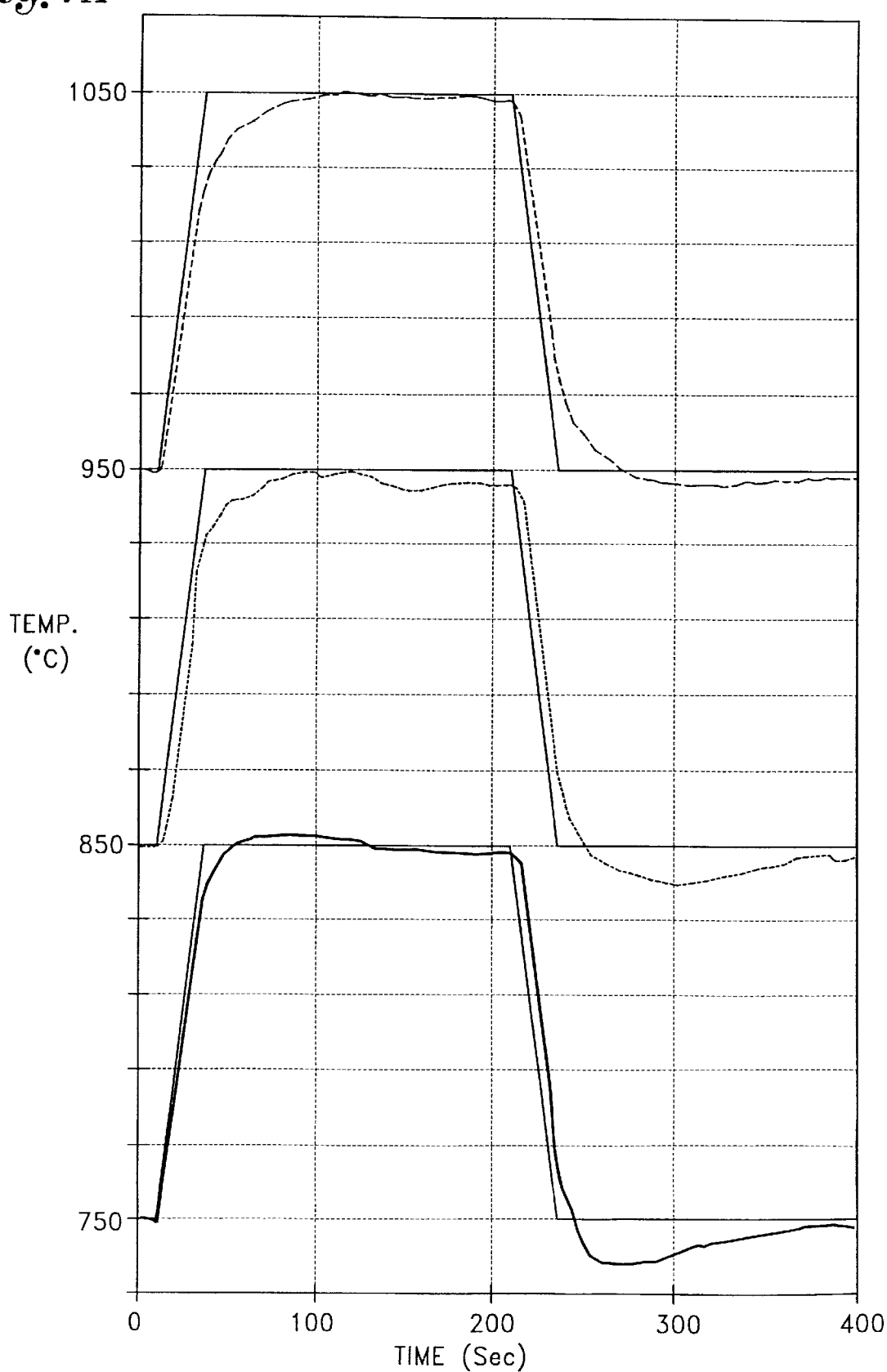
FIG. 7A is a graph of three different temperature ramps of the same temperature differences but with three different initial temperatures.
Figure 7B:
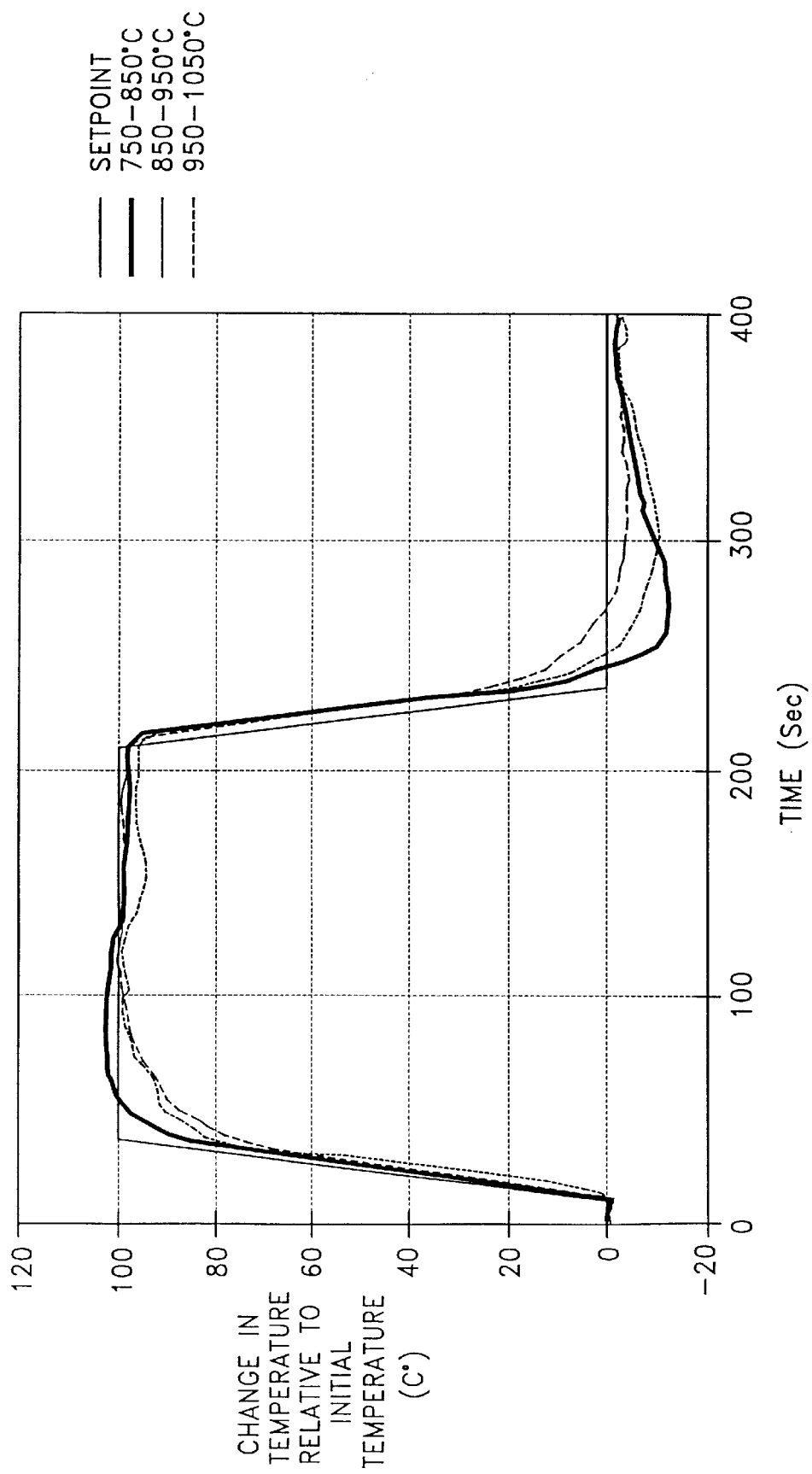
FIG. 7B is a graph showing the superposition of the three temperature ramps of FIG. 7A.

With reference to FIGS. 7A and 7B, for instance, the same temperature ramps $\Delta T$ of +100° C. and −100° C. are shown for three different setpoints at three different temperature ranges, that is, at different initial and final temperatures $T_i$, $T_f$. FIG. 7B superposes the temperature ramps at the different absolute temperatures. As illustrated, the time lag $\Delta t$ between setpoint reaching the treatment plateaus and the wafer temperature reaching stability at or near the treatment plateaus is approximately equal for each of the three setpoints. Accordingly, the setpoint and wafer curves for a +100° C. ramp can simply be shifted to different initial and final temperatures, and approximately the same relationship obtains. It can be shown that the same is true for different sizes of temperature ramp $\Delta T$ (e.g., +200° C.).

Generally, the accuracy with which the wafer cools to the desired level is not as critical as the speed and accuracy with which the wafer heats to the treatment temperature. For example, the wafer might be cooled only to reach a temperature level which the wafer handling device can tolerate. Fluctuation in this temperature will not critically affect the quality of structures upon the wafer, and the wafer handling device can tolerate the fluctuations without incurring damage. Accordingly, the PID controller can be set for critically tuning the heating ramp even if the cooling ramp is not critically tuned at those settings. The time lags for the cooling ramps are thus longer than the lags for the heating ramps, though the time lags remain about equal to one another (i.e., the wafer temperature reaches stability at about the same time after the setpoint for each different setpoint).

Figure 8:
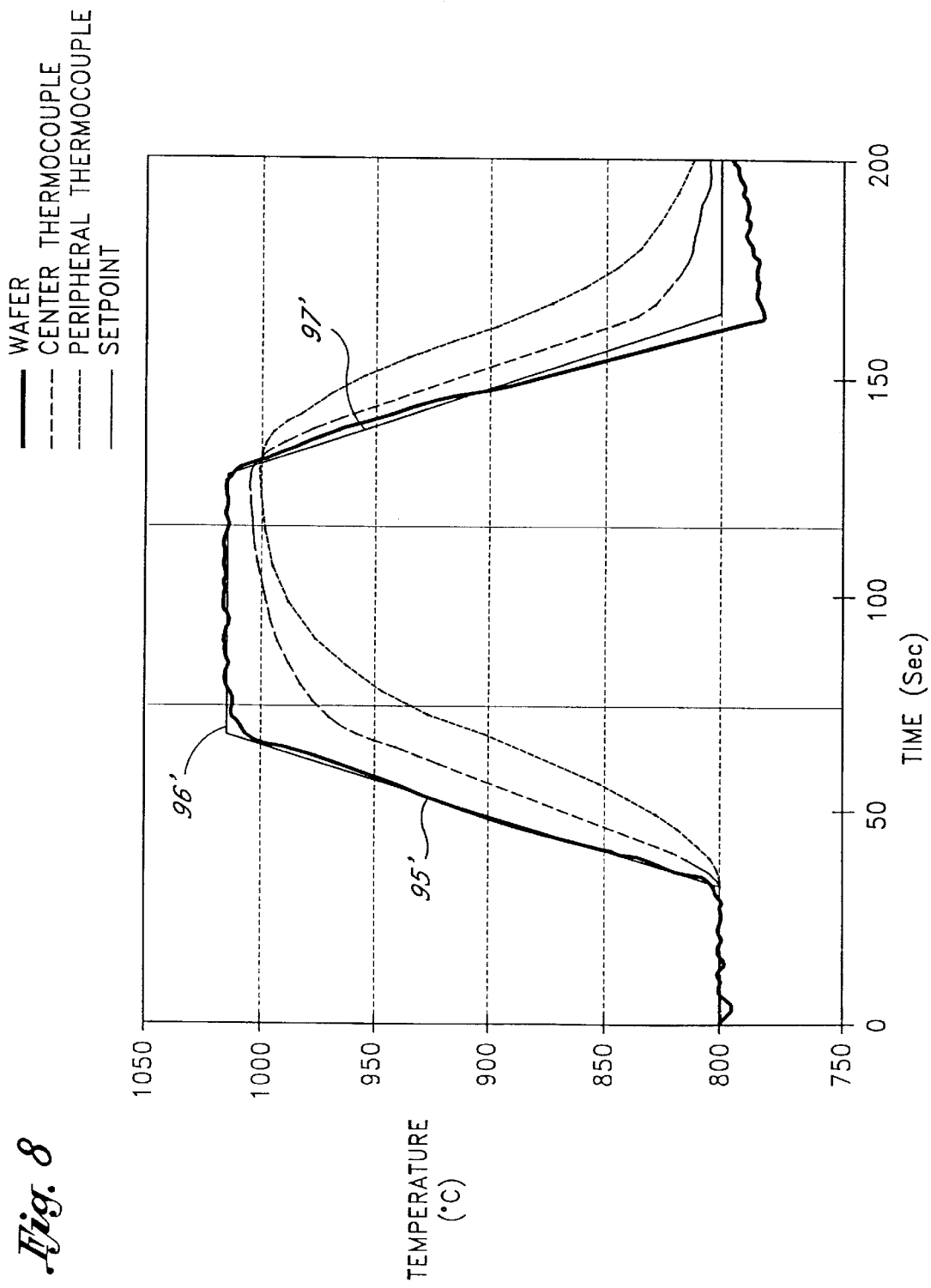
FIG. 8 is a graph of a calibration run for determining the time to begin the deposition treatment in the exemplary epitaxial process of FIG. 4.

FIG. 8 illustrates a calibration step 112 (FIG. 6) in accordance with the method of the preferred embodiment.

The setpoint for the calibration corresponds to heating ramp 95, the treatment plateau 96, and the cooling ramp 97 of FIG. 4. For this case, the heating stage 95, from an initial temperature $T_i$ of 900° C. to a final temperature $T_f$ of 1120° C., gives a $\Delta T$ of about +220° C. As the instrumented wafer cannot be used to calibrate and determine the time lag $\Delta t$ at temperatures as high as 1120° C., the calibration run can be conducted at a lower temperature. In the calibration curve of FIG. 8, the calibration heating ramp 95' is conducted from $T_1$ =800° C. to $T_2$=1020° C., giving the same temperature ramp $\Delta T$ of +220° C. as the actual process (FIG. 4). The time lag $\Delta t$, calculated from the calibration run 112 is about 10 seconds.

Referring now to FIGS. 4 and 6, when conducting an actual epitaxial process corresponding to the setpoint 90, the wafer temperature is ramped from $T_i$=900° C. to $T_f$=1120° C., in accordance with the heating ramp 95. About 10 seconds after the setpoint reaches the treatment temperature 96, the reactant gases for the epitaxial deposition can be introduced to the reaction chamber 12 (FIG. 1). The treatment (epitaxial deposition) takes only about 50 seconds. Accordingly, the wafer temperature can be ramped down about 50 seconds after introducing the reactant gases, in accordance with the setpoint cooling ramp 97.

Referring now again to FIG. 8, it can be seen that, 50 seconds after the wafer temperature reaches stability in the calibration curve, the temperatures of the center thermocouple and peripheral thermocouples (one shown) would still be climbing. As noted above, while FIG. 8 shows the calibration curves at a lower temperature than the actual process (FIG. 4), FIG. 8 nevertheless is indicative of the relative behavior of the wafer and thermocouples at the higher temperatures of the actual process. Accordingly, the method of the preferred embodiment permits completion of the treatment process, in this case an epitaxial deposition, even before the thermocouples reach stability. Advantageously, this represents a significant time savings over prior art methods of processing, wherein the treatment process would not even have begun at the point where the present method has completed the treatment.

It will be appreciated by those skilled in the art that various modifications and changes may be made without departing from the scope of the invention, and all such modifications and changes are intended to fall within the scope of the invention, as defined by the appended claims.

We claim:

1. A semiconductor processing apparatus, comprising:
   a processing chamber;
   a support structure for supporting a wafer within the processing chamber;
   a plurality of heating elements arranged to heat the wafer within the processing chamber;
   a temperature sensor arranged to be loosely thermally coupled to the wafer when the wafer is supported within the processing chamber; and
   a temperature controller connected to at least one of the heating elements and the temperature sensor for controlling the temperature of the temperature sensor during a temperature ramp.

2. The semiconductor processing apparatus of claim 1, wherein the support structure comprises a quartz spider.

3. The semiconductor processing apparatus of claim 2, wherein the support structure further comprises a low mass wafer holder.

4. The semiconductor processing apparatus of claim 3, wherein the temperature sensor senses the temperature at a distance between about 0.030 inch and 0.070 inch from the low mass wafer holder.

5. The semiconductor processing apparatus of claim 1, wherein the wafer and temperature sensor have a characteristic time constant greater than about 0.3 times the ramp time.

6. The semiconductor processing apparatus of claim 1, wherein the temperature sensor is arranged to be spaced below the wafer when the wafer is supported within the processing chamber.

7. The semiconductor processing apparatus of claim 6, further comprising a plurality of peripheral temperature sensors and peripheral controllers for maintaining a uniform temperature distribution across the wafer.

8. The semiconductor processing apparatus of claim 1, wherein the processing chamber comprises a quartz chamber and the heating elements comprise radiant heat lamps position outside the processing chamber.

9. A chemical vapor deposition apparatus for depositing layers upon a semiconductor substrate, comprising:
   a single substrate support structure, the support structure having a thermal mass less than about five times a thermal mass of the substrate;
   a process chamber sized for supporting a single substrate upon the support structure;
   a temperature controller connected to a heat source; and
   a temperature sensor driving the temperature controller, the temperature sensor arranged to sense temperature at a point spaced at least about 0.010 inch from the support structure.

10. The apparatus of claim 9, wherein the temperature sensor is arranged to sense temperature at a point between about 0.030 inch and 0.070 inch from the support structure.

11. The apparatus of claim 9, wherein the temperature controller is programmed for ramping temperature from a first temperature to a second temperature over a ramp time and the substrate and the temperature sensor have a characteristic time constant greater than about 0.3 times the ramp time.

12. The apparatus of claim 11, wherein the substrate and the temperature sensor have a characteristic time constant greater than about 0.5 times the ramp time.

13. The apparatus of claim 9, wherein the support structure comprises a quartz spider.

14. The apparatus of claim 9, wherein the temperature controller comprises a PID controller.

15. The apparatus of claim 9, wherein the thermal mass of the substrate support is less than about 3 times the thermal mass of the substrate.

16. The apparatus of claim 9, wherein the thermal mass of the substrate support is between about 0.5 and two times the thermal mass of the substrate.

17. The apparatus of claim 9, wherein the process chamber comprises a quartz chamber and the heat source comprises radiant heat lamps positioned outside the process chamber.

* * * * *